United States Patent
Yang et al.

(10) Patent No.: US 9,910,730 B2
(45) Date of Patent: Mar. 6, 2018

(54) SYSTEM FOR HANDLING ERRATIC WORD LINES FOR NON-VOLATILE MEMORY

(71) Applicant: SANDISK TECHNOLOGIES INC., Plano, TX (US)

(72) Inventors: Nian Niles Yang, Mountain View, CA (US); Chris Avila, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 2 days.

(21) Appl. No.: 14/918,796

(22) Filed: Oct. 21, 2015

(65) Prior Publication Data

US 2017/0116075 A1    Apr. 27, 2017

(51) Int. Cl.
    *G11C 29/00*      (2006.01)
    *G06F 11/10*      (2006.01)
    *G11C 29/52*      (2006.01)

(52) U.S. Cl.
    CPC .......... *G06F 11/1068* (2013.01); *G11C 29/52* (2013.01)

(58) Field of Classification Search
    CPC ............................ G11C 29/52; G06F 11/1068
    See application file for complete search history.

(56) References Cited

U.S. PATENT DOCUMENTS

| | | | |
|---|---|---|---|
| 5,574,684 A | 11/1996 | Tomeoda | |
| 7,808,831 B2 | 10/2010 | Mokhlesi | |
| 7,817,469 B2 | 10/2010 | Avraham | |
| 7,852,683 B2 | 12/2010 | Lutze | |
| 7,859,932 B2 | 12/2010 | Mokhlesi | |
| 8,310,870 B2 | 11/2012 | Dutta | |
| 8,972,652 B2 | 3/2015 | Kim | |
| 8,982,653 B2 | 3/2015 | Nurminen | |
| 9,019,771 B2 | 4/2015 | Lung | |
| 2005/0073884 A1* | 4/2005 | Gonzalez | G06F 11/106 365/185.02 |
| 2014/0119115 A1* | 5/2014 | Jung | G11C 11/5628 365/185.03 |

OTHER PUBLICATIONS

Tang, et al., "Dependence of Electrons Loss Behavior on the Nitride Thickness and Temperature for Charge Trap Flash Memory Applications," Transactions on Electrical and Electronic Materials, vol. 15, No. 5, pp. 245-248, Oct. 25, 2014.

* cited by examiner

*Primary Examiner* — Guy Lamarre
(74) *Attorney, Agent, or Firm* — Vierra Magen Marcus LLP

(57) ABSTRACT

A non-volatile storage system identifies a word line with an open neighbor word line and determines whether data stored in non-volatile memory cells connected to the identified word line has an error condition. If the data does have an error condition, then an attempt is made to fix the data and the open neighbor word line is checked for errors. If the open neighbor word line has errors, then memory cells connected to the open neighbor word line are programmed with pseudo data.

22 Claims, 16 Drawing Sheets

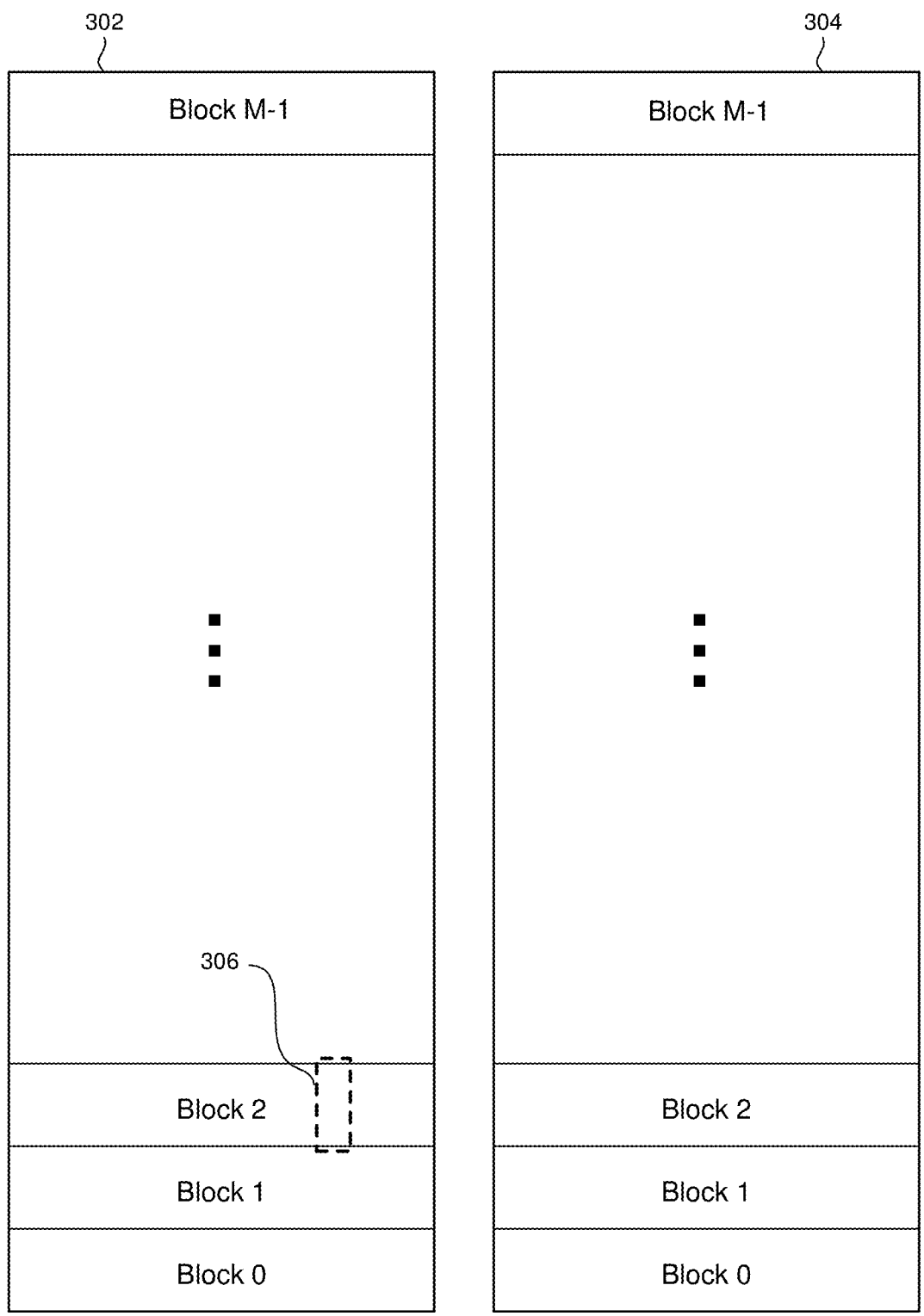

Fig. 12
| Physical WL | Finger 0 | Finger 1 | Finger 2 | Finger 3 |
|---|---|---|---|---|
| WLL0 | 0 | 1 | 2 | 3 |
| WLL1 | 4 | 5 | 6 | 7 |
| WLL2 | 8 | 9 | 10 | 11 |
| WLL3 | 12 | 13 | 14 | 15 |
| WLL4 | 16 | 17 | 18 | 19 |
| WLL5 | 20 | 21 | 22 | 23 |
| WLL6 | 24 | 25 | 26 | 27 |
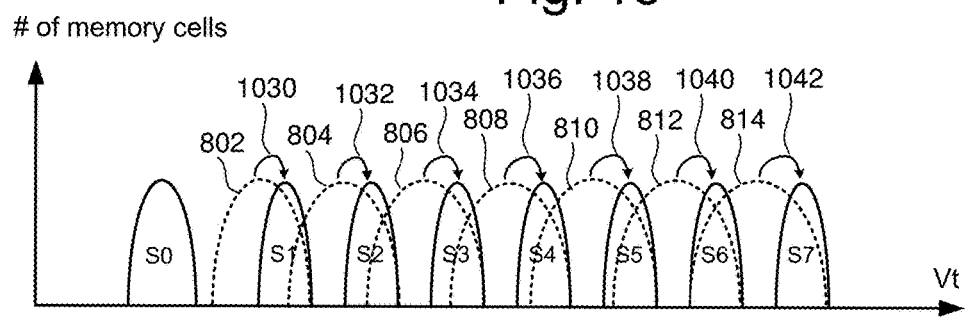
Fig. 15
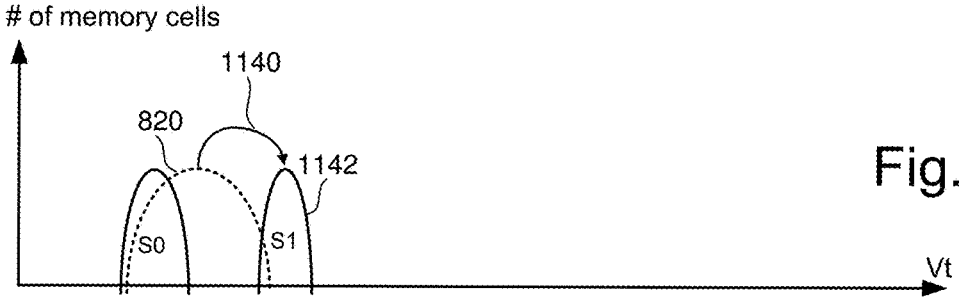
Fig. 16

SYSTEM FOR HANDLING ERRATIC WORD LINES FOR NON-VOLATILE MEMORY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. Each memory cell can store one or more bits of data.

Historically, data retention has been an issue to consider for non-volatile memory. Data retention can be thought of as the ability to maintain accurate storage of data over a period of time. With some non-volatile memory, the information stored in a memory cell can change (also known as drift) over time.

BRIEF DESCRIPTION OF THE DRAWINGS

Like-numbered elements refer to common components in the different figures.

FIG. 4A is a block diagram of a memory structure having two planes.

FIG. 12 is a table describing the state of logical word lines.

FIG. 15 depicts threshold voltage distributions.

FIG. 16 depicts threshold voltage distributions.

DETAILED DESCRIPTION

Data is typically programmed on a word line (physical word line or logical word line) basis. In other words, memory cells connected to a common word line are often programmed together. Once all of the memory cells connected to the common word line have completed the programming process (including some memory cells remaining in the erased states due to the data pattern being stored), that word line is referred to as a closed word line. Prior to the programming of the memory cells connected to a word line, the word line is referred to as an open word line. In one embodiment, the memory cells connected to an open word line are supposed to be in the erased state.

In some memory systems, a charge-trapping material is arranged vertically through a stack of alternating conductive and dielectric layers. In this arrangement, the charge-trapping material (e.g., Silicon Nitride) runs across multiple memory cells. It has been discovered that in some instances electrons from the charge-trapping material of a programmed memory cell (e.g., on a closed word line) may migrate to a neighboring memory cell that is not programmed (e.g., on an open word line), which may lead to an error in the programmed data. The issue can be exacerbated in high temperatures.

To combat the above-described issue, the memory system identifies a word line (e.g., a closed word line) with an open neighbor word line and determines whether data stored in non-volatile memory cells connected to the identified word line has an error condition. If the data does have an error condition, then an attempt is made to fix the data. It is possible that the error is due to electrons drifting from the higher charged portions of the charge trapping material for the memory cells connected to the identified word line (e.g., a closed word line) to the lower charged portions of the charge trapping material for the memory cells connected to open neighbor word line.

Fixing the data on the identified word line will address past drifting. To prevent future drifting, the open neighbor word line is checked for errors. If the open neighbor word line has errors, then memory cells connected to the open neighbor word line are programmed with pseudo data. Programming the memory cells on the open neighbor word with pseudo data, will increase the amount of charge in the charge trapping material for the memory cells connected to open neighbor word line, thereby reducing the potential for electrons to drift within the charge trapping material from memory cells connected to the identified word line to the memory cells connected to open neighbor word line.

The above-described technique can be performed at power on, power off, detection of a high temperature, randomly or at some other instance.

The following discussion provides details of one example of a suitable structure for memory devices that can implement the proposed technology.

Figure 1:
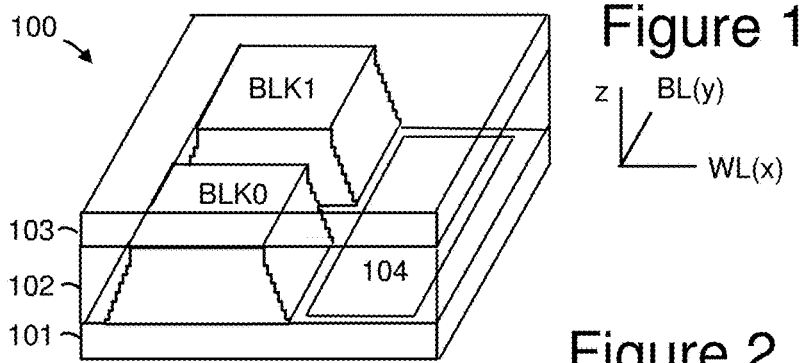
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
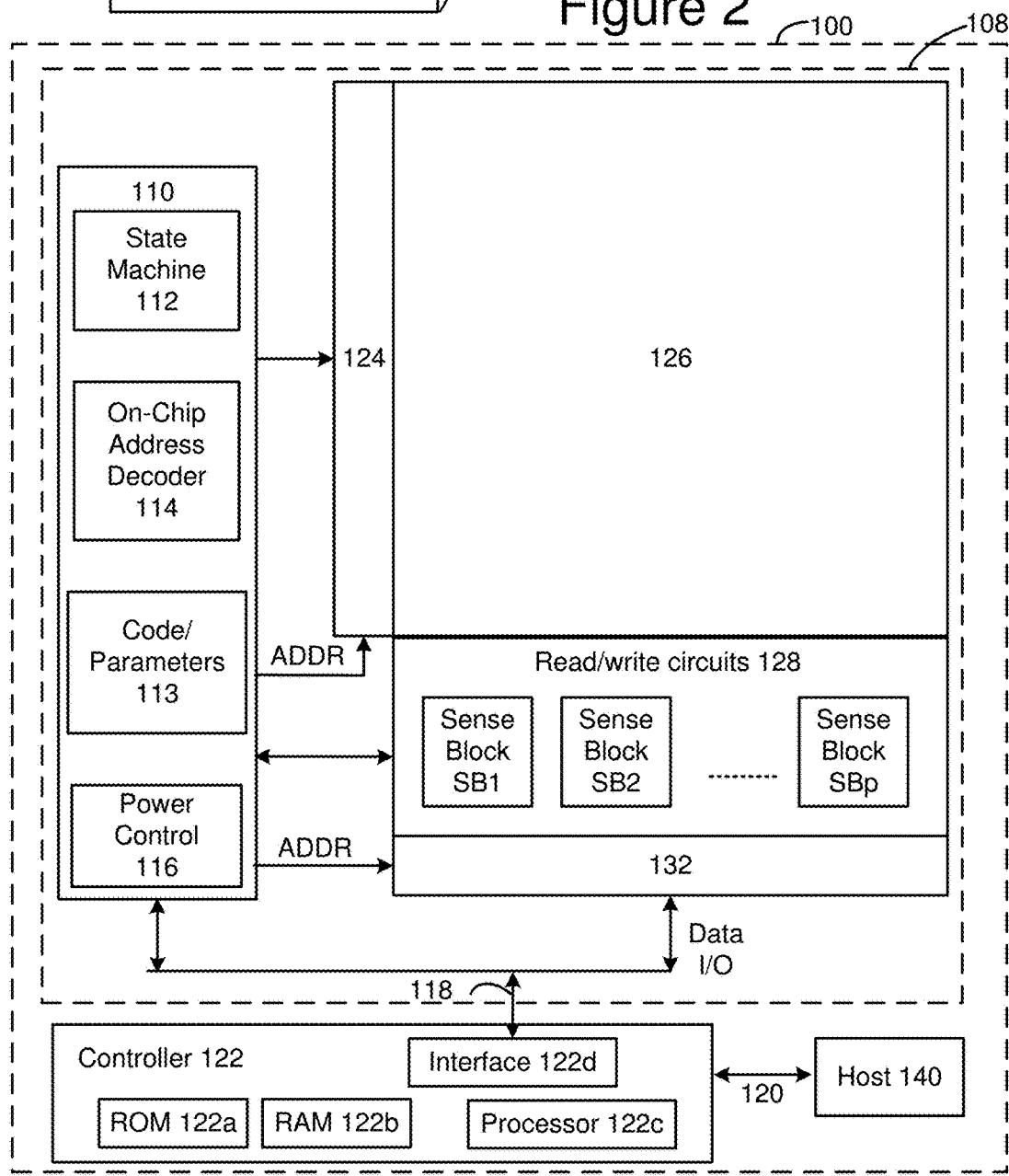
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . ,SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . ,SBp, read/write circuits 128, and controller 122 can be considered one or more control circuits that performs the functions described herein.

The (on-chip or off-chip) controller 122 may comprise a processor 122c, ROM 122a, RAM 122band a Memory Interface 122d. The storage devices (ROM 122a, RAM 122b) comprises code such as a set of instructions, and the processor 122c is operable to execute the set of instructions to provide the functionality described herein. Alternatively or additionally, processor 122ccan access code from a storage device in the memory structure, such as a reserved area of memory cells connected to one or more word lines. Memory interface 122d, in communication with ROM 122a, RAM 122band processor 122c, is an electrical circuit that provides an electrical interface between controller 122 and memory die 108. For example, memory interface 122dcan change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
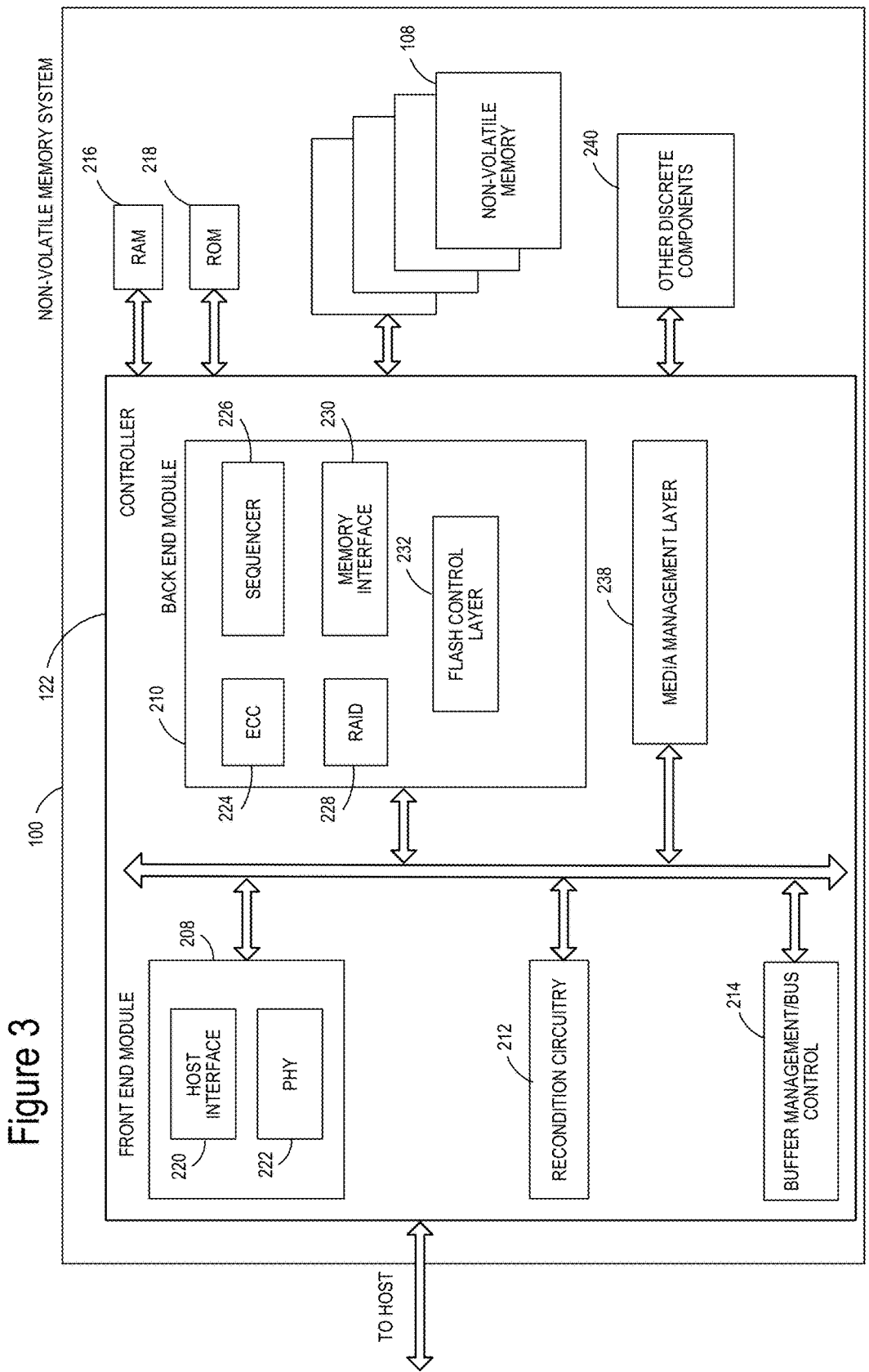
FIG. 3 is a block diagram depicting one embodiment of a controller.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller.

In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Drives) module 228 manages generation of RAID parity and recovery of failed data. The RAID parity may be used as an additional level of integrity protection for the data being written into the non-volatile memory system 100. In some cases, the RAID module 228 may be a part of the ECC engine 224. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The FTL or MML 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used.

Figure 4B:
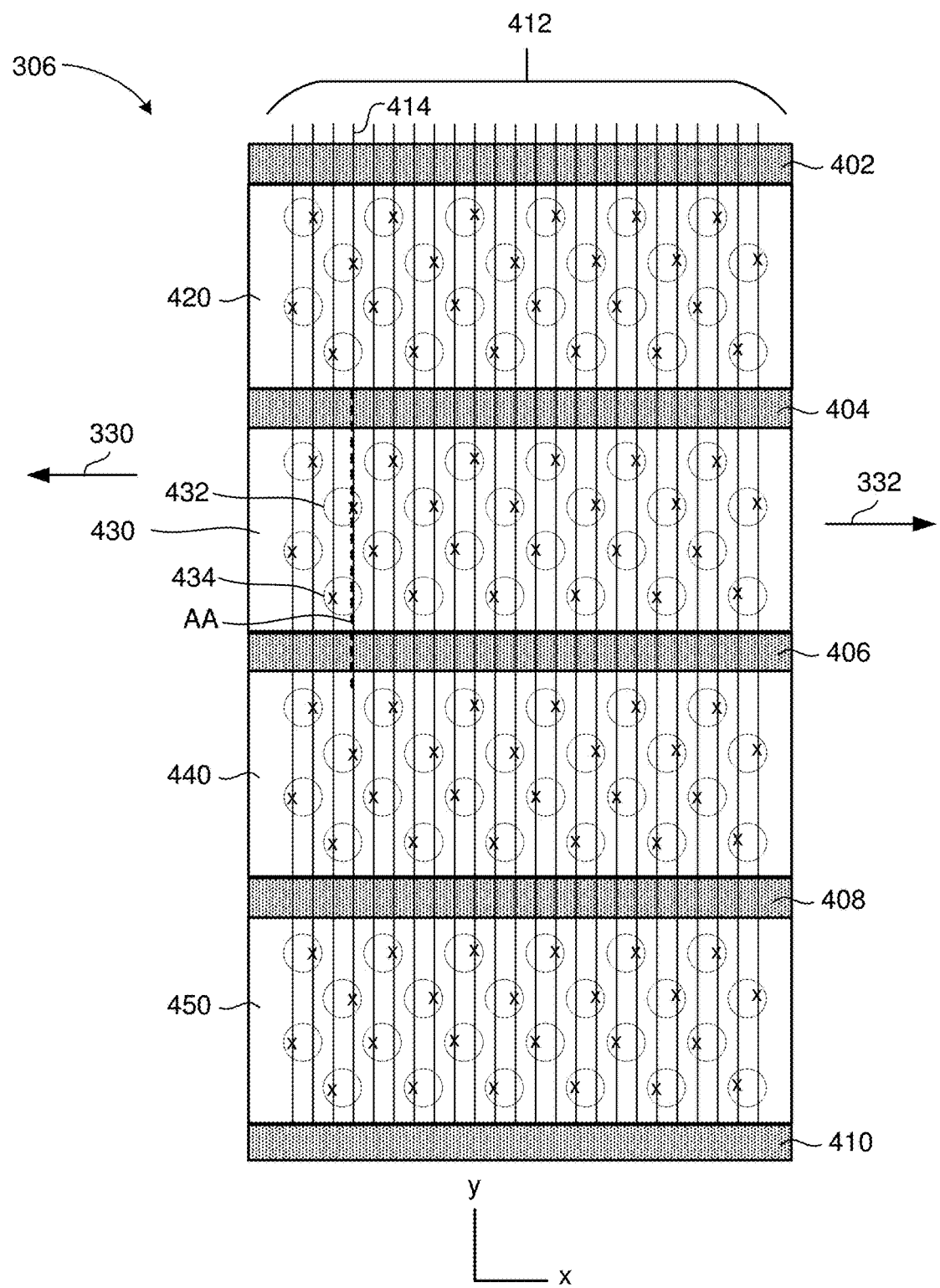
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 330 and in the direction of arrow 332. In one embodiment, the memory array will have 60 layers. Other embodiments have less than or more than 60 layers. However, FIG. 4B only shows the top layer.

FIG. 4B depicts a plurality of circles that represent the vertical columns Each of the vertical columns include multiple select transistors and multiple memory cells. In one embodiment, each vertical column implements a NAND string. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 412. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4B includes a set of local interconnects 402, 404, 406, 408 and 410 that connect the various layers to a source line below the vertical columns Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
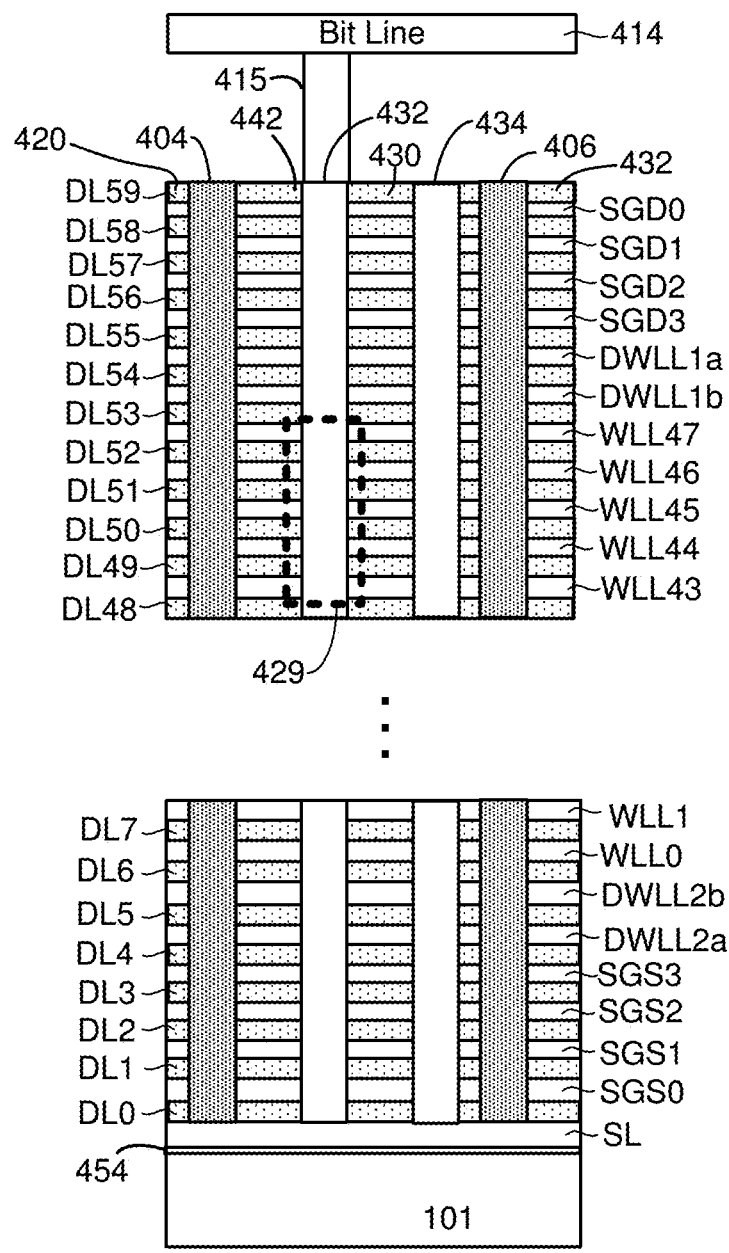
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
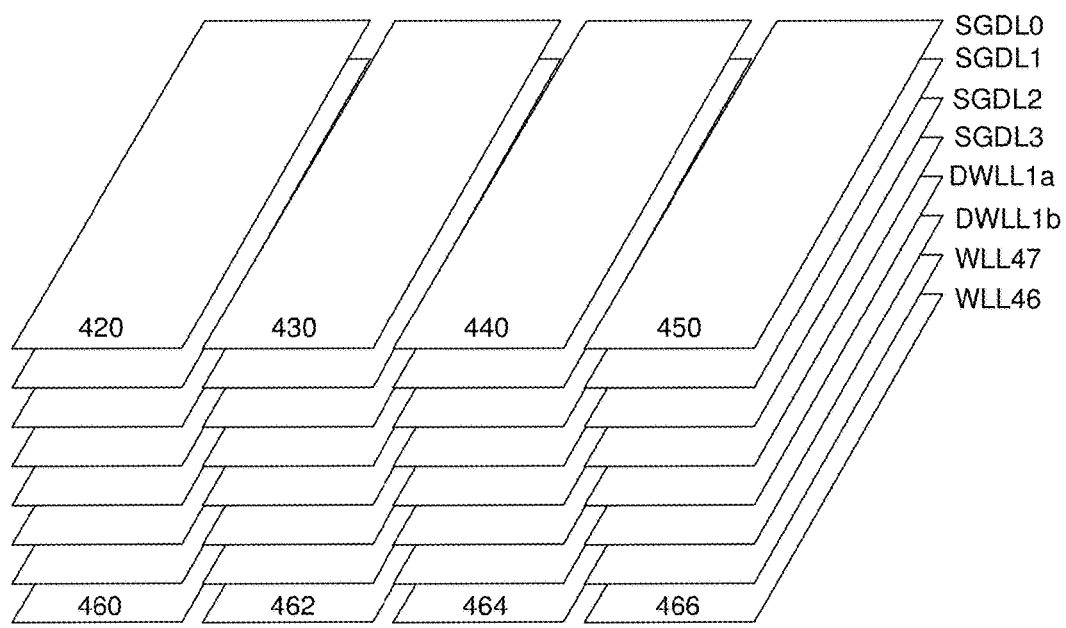
FIG. 4D depicts a view of the select gate layers and word line layers.
Figure 4D:
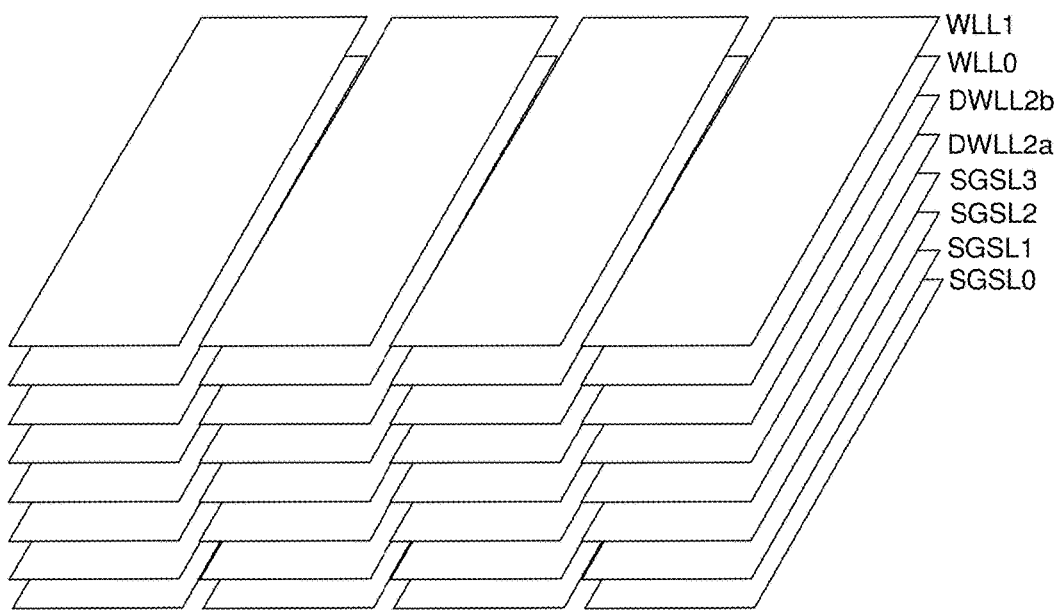

FIG. 4D depicts a logical representation of the conductive layers (SGD0, SGD1,SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
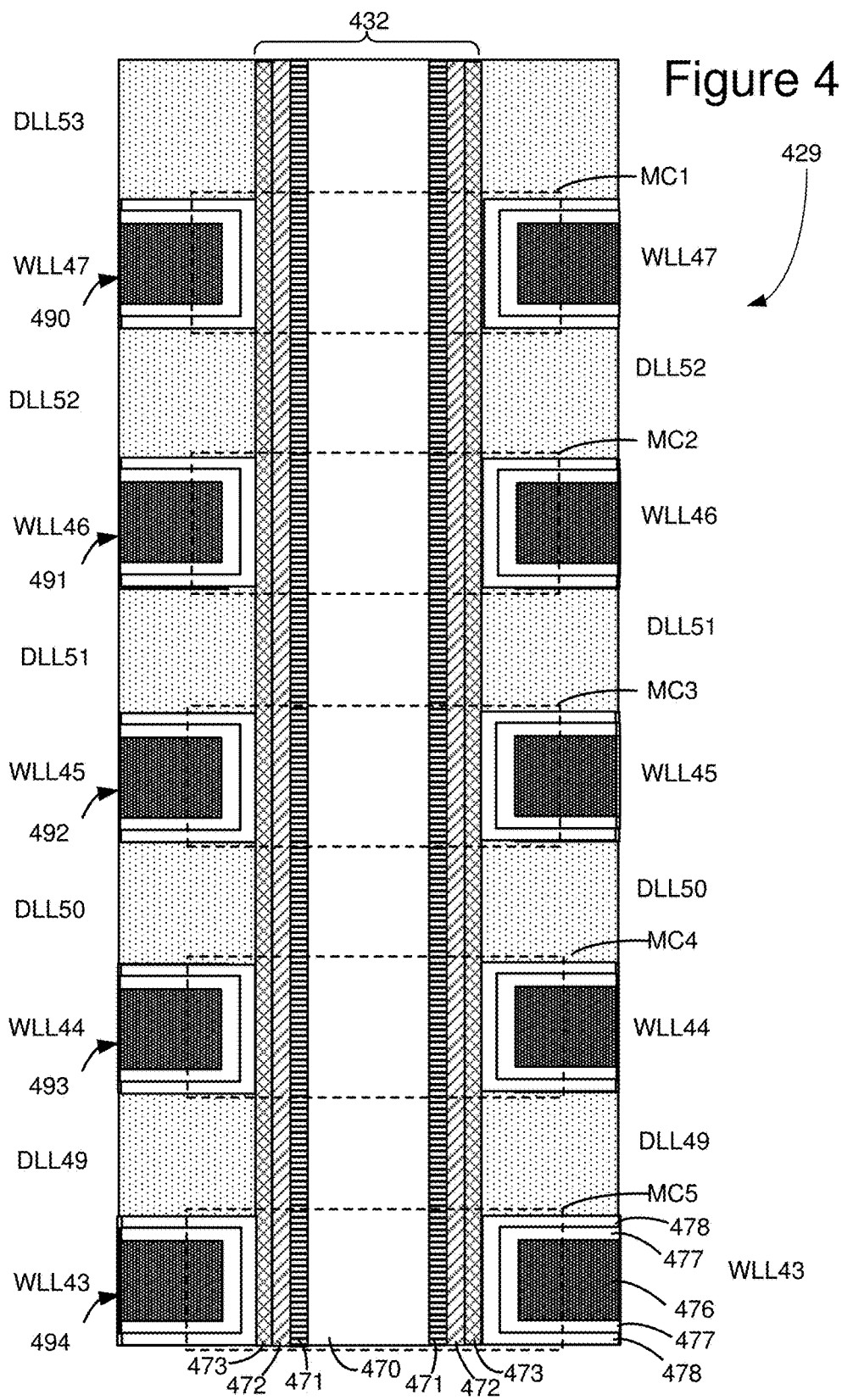
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
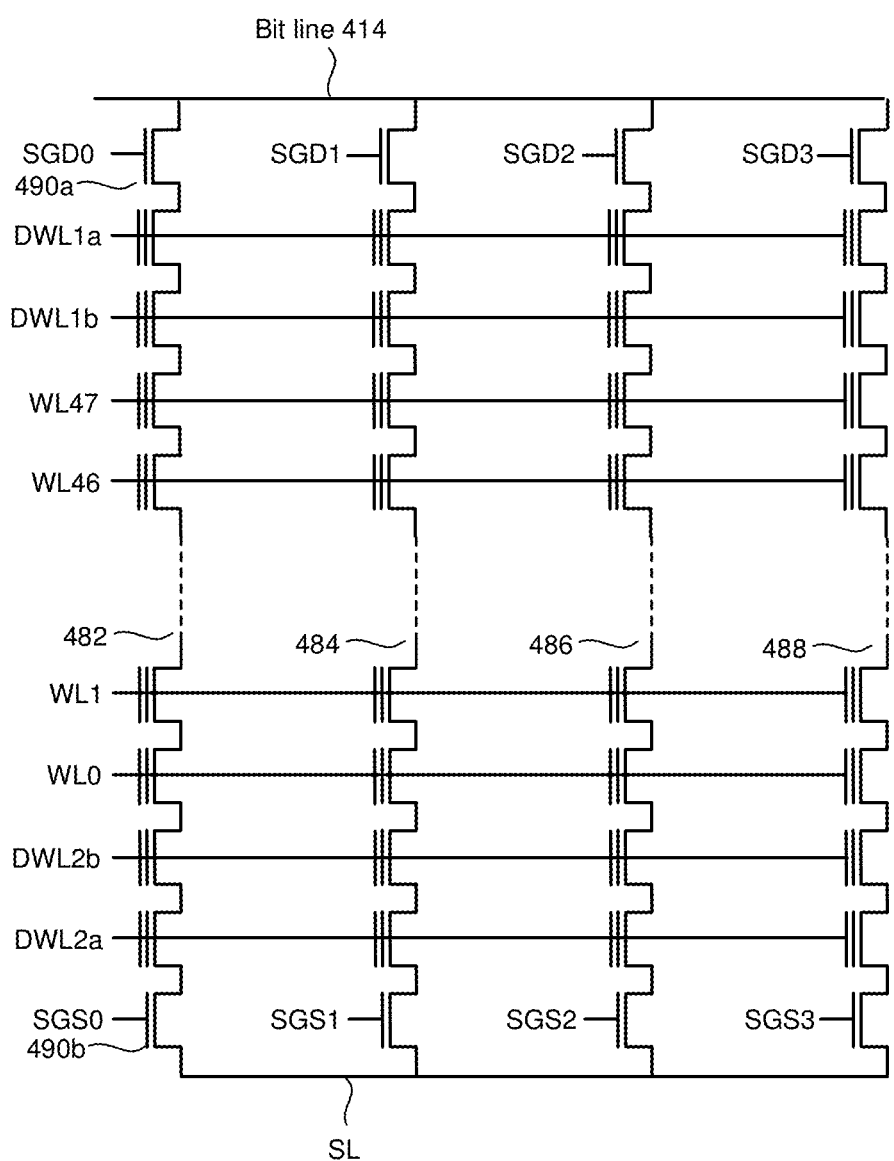
FIG. 4F is a schematic of a plurality of NAND strings.

FIG. 4F is a logical circuit diagram depicting a plurality of groups of connected programmable and erasable non-volatile memory cells arranged as four NAND strings 482, 484, 486 and 488 connected to bit line 414 and source line SL. The select lines SGD0, SGD1, SGD2, SGD3, SGS0, SGS1, SGS2, AND SGS3 are used to select/unselect the depicted NAND strings. In one embodiment all four drain side select lines (SGD0, SGD1, SGD2, SGD3) connect to each NAND string, but logically only one select line is used to select (actuate) each NAND strings. For example, SGD0 is used to select NAND string 482 to connect NAND string 482 to bit line 414, SGD1 is used to select NAND string 484 to connect NAND string 484 to bit line 414, SGD2 is used to select NAND string 486 to connect NAND string 486 to bit line 414, SGD3 is used to select NAND string 488 to connect NAND string 488 to bit line 414. Similarly, in one embodiment all four drain side select lines (SGS0, SGS1, SGS2, SGS3) connect to each NAND string, but logically only one select line is used to select (actuate) each NAND strings. For example, SGS0 is used to select NAND string 482 to connect NAND string 482 to common source line SL, SGS1 is used to select NAND string 484 to connect NAND string 484 to common source line SL, SGS2 is used to select NAND string 486 to connect NAND string 486 to common source line SL, SGS3 is used to select NAND string 488 to connect NAND string 488 to common source line SL. For example, to connect NAND string 482 to bit line 414, select gate 490b must be turned on (via select line SGD0) and to connect NAND string 482 to source line SL, select gate 490b must be turned on (via select line SGS0).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 5:
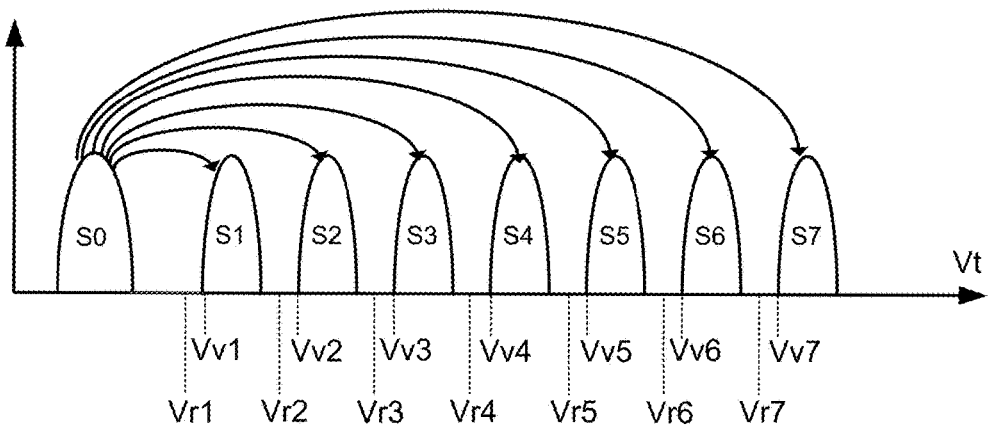
FIG. 5 depicts threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with controller 122 relying on ECC to identify the correct data being stored.

Figure 6A:
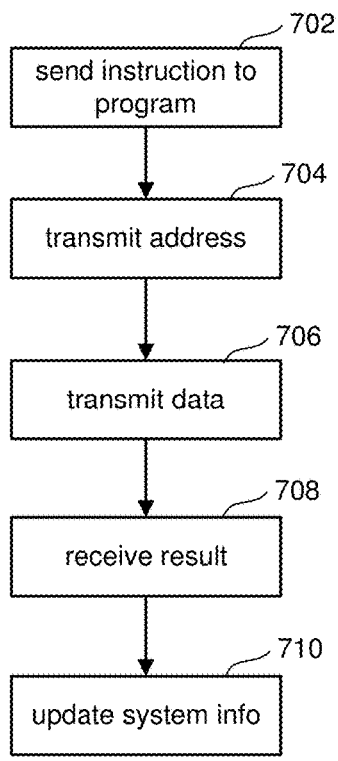
FIG. 6A is a flow chart describing one embodiment of a process for programming.

FIG. 6A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more logical addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive user data and an instruction to program from the host, and the controller would run the ECC engine to create code words from the user data. These code words are the data transmitted in step 706.

Figure 6B:
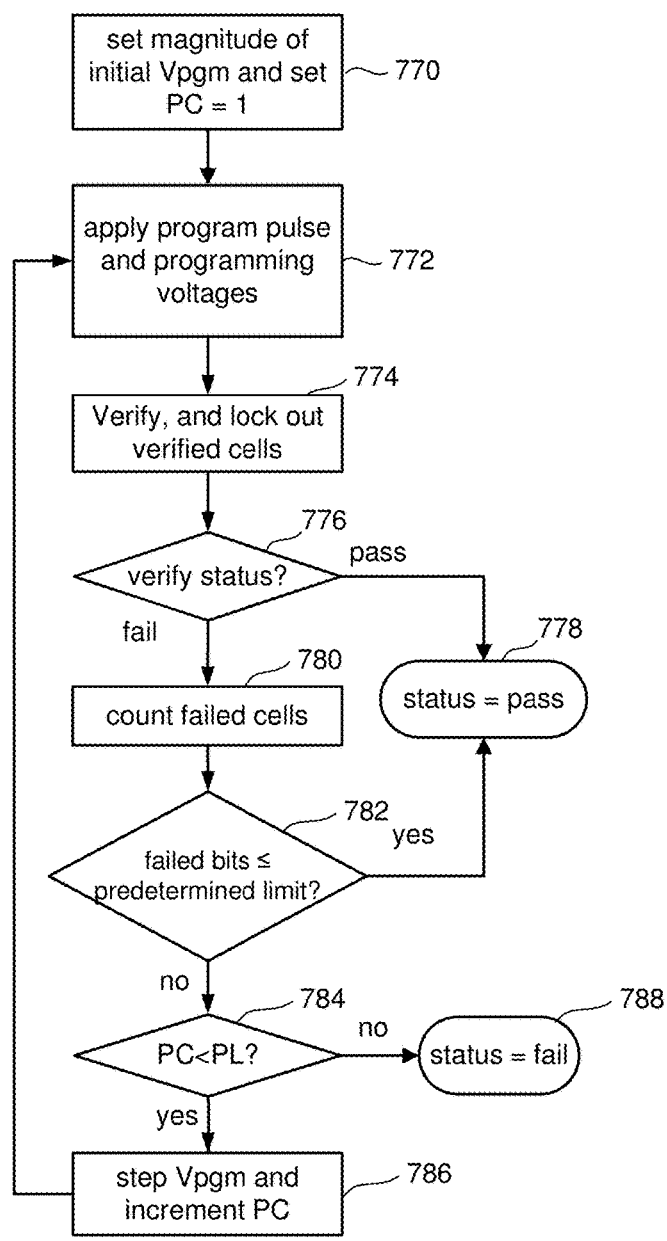
FIG. 6B is a flow chart describing one embodiment of a process for programming.

FIG. 6B is a flowchart describing one embodiment of a process for programming. The process of FIG. 6B is performed by the memory die in response to the steps of FIG. 6A (in response to the instructions, data and addresses from controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

FIGS. 4B-4E described a three dimensional memory array that includes vertical layers of charge trapping material in the memory holes that runs across multiple memory cells. For example, FIG. 4E shows charge trapping layer 473 passing through memory cells MC1, MC2, MC3, MC4, and MC5, without any physical barriers in charge trapping layer 473 between the memory cells. It has been discovered that in some instances electrons from the charge-trapping material of a programmed memory cell (e.g., on a closed word line) may migrate to a neighboring memory cell that is not programmed (e.g., on an open word line), which may lead to an error in the programmed data. In other words, electrons overtime move from where there is a high concentration of electrons to where there is a lower concentration of electrons. The issue can be exacerbated in high temperatures.

Figure 7:
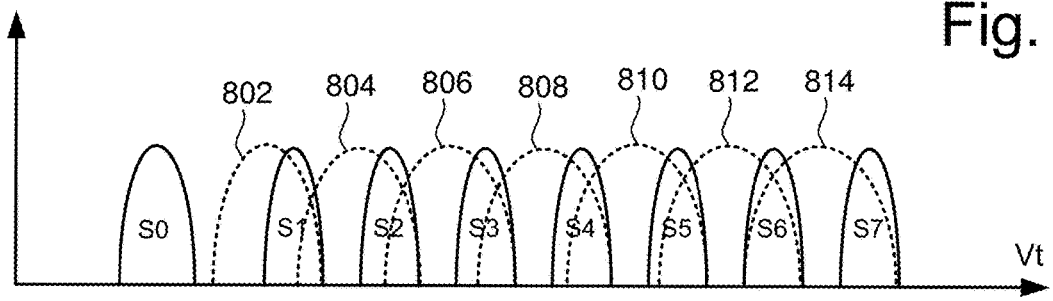
FIG. 7 depicts threshold voltage distributions.

FIG. 7 depicts the threshold voltages of FIG. 5 for a population of memory cells connected to a closed word line that is next to another word line that is an open word line (herein referred to as an open neighbor word line). Figure depicts the situation where over time electrons migrated along the charge trapping layers from memory cells connected to the closed word line to memory cells connected to the open neighbor word line. As a result, the threshold voltage distributions shifted down from S1-S7 to threshold distributions 802-814, which represent one example of an error condition. The threshold voltage distribution for data state S1 shifted down in voltage to threshold voltage distribution 802. The threshold voltage distribution for data state S2 shifted down in voltage to threshold voltage distribution 804. The threshold voltage distribution for data state S3 shifted down in voltage to threshold voltage distribution 806. The threshold voltage distribution for data state S4 shifted down in voltage to threshold voltage distribution 808. The threshold voltage distribution for data state S5 shifted down in voltage to threshold voltage distribution 810. The threshold voltage distribution for data state S6 shifted down in voltage to threshold voltage distribution 812. The threshold voltage distribution for data state S7 shifted down in voltage to threshold voltage distribution 814. If the threshold voltage shift to much, the system will experience errors when reading the data. This is known as a data retention error that results in the word line (including the memory cells connected to the word line) performing in an erratic manner (ie erratic word line).

Figure 8:
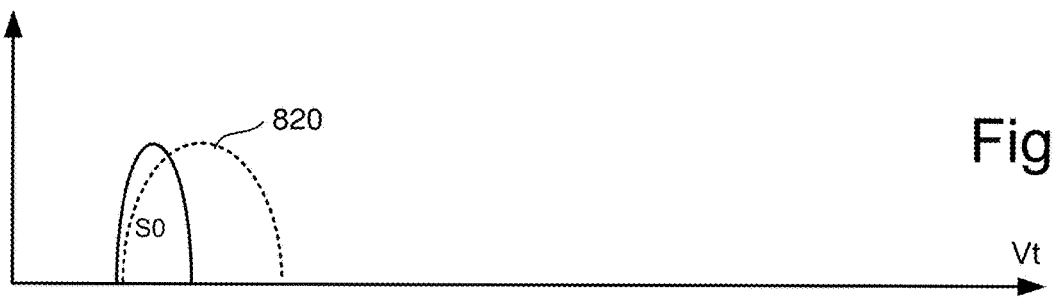
FIG. 8 depicts threshold voltage distributions.

The data retention error described above with respect to FIG. 7 includes electrons migrating along the charge trapping layers from memory cells connected to the closed word line to memory cells connected to the open neighbor word line. Therefore, the threshold voltages of memory cells connected to the open neighbor word line may also be affected. FIG. 8 depicts the threshold voltage of the erased state S0 (ie the fully erased condition) for memory cells connected to the open neighbor word line after electrons migrated along the charge trapping layers from memory cells connected to the closed word line to memory cells connected to the open neighbor word line. In this case, the threshold voltage distribution for data state S0 shifted up in voltage to threshold voltage distribution 820. This shift in threshold voltage can cause an error in future programming because some of the memory cells may move out of data state S0 (when future data may require them to be in state 0), some of the memory cells may move past data state S1 (when future data may require them to be in data state 0 or data state 1), or some memory cells may get over programmed in the future.

Figure 9:
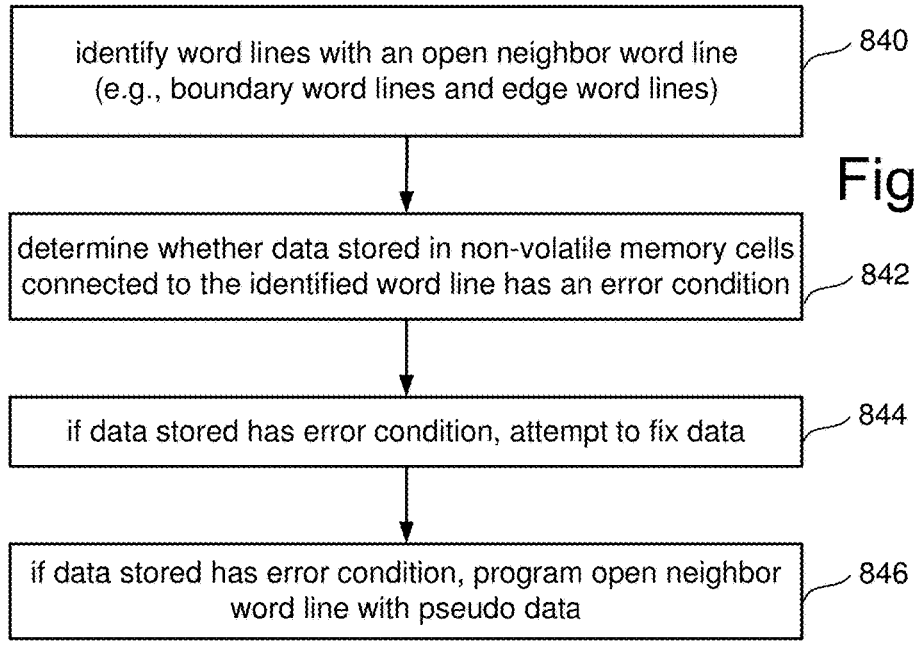
FIG. 9 is a flow chart describing one embodiment of an erratic word line maintenance process.

FIG. 9 is a flowchart describing one embodiment of a process for performing erratic word line maintenance in order to resolve the data retention issues described above. Step 840 includes identifying word lines with an open neighbor word line An open neighbor word line is an adjacent word line that is an open word line. In one set of embodiments, there are two types of word lines that will have an open neighbor word line: a boundary word line and an edge word line. A boundary word line is a user data word line (a word line connected to memory cells that are intended to store user data) that is a closed word line and is adjacent a user data word line that is an open word line. An edge word line is a closed word line that is either the first or last word line of the user data word lines of a block and is adjacent to a dummy word line (ie the dummy word line is the open neighbor word line, if the dummy word line is open). In one embodiment, controller 122 performs step 840 using the system information stored inside the controller 122. In other embodiments, other control circuits can perform step 840.

In step 842 of FIG. 9, controller 122 (or other control circuit) determines whether data stored in the nonvolatile memory cells connected to the identified word line (see step 840) has an error condition. An error condition exists when the data being stored by the set of one or more memory cells has more than a predetermined number of errors. For example, the bit error rate may be greater than a predetermined number, the threshold voltage distributions of the programmed data may have shifted more than a tolerance, or another property of the memory cells may have changed in an unwanted fashion. In one embodiment, controller 122 (or other control circuit) performs step 842 by causing a read or sense operation to be performed on the memory cells connected to the identified word line. In another embodiment, step 842 includes performing a scan of the threshold voltage of all (or a subset) of memory cells in order to reconstruct the threshold voltage distributions in an effort to determine whether the threshold voltage distributions of the programmed data states have shifted more than a tolerance.

In step 844, controller 122 (or other control circuit) attempts to fix the data stored in the memory cells connected to the identified word line if (in step 842) controller 122 (or other control circuit) determined that the data being stored has the error condition. In step 846, if the data stored in the memory cells connected to the identified word line has the error condition, controller 122 (or other control circuit) programs the memory cells connected to the open neighbor word line with pseudo data. In one embodiment, pseudo data is fake data, it is not data that the host instructed the memory system to store. The pseudo data could be random information, a predetermined sequence of information, a copy of real user data, etc. While one embodiment includes the process of FIG. 9 being performed by controller 122, other embodiments include the process of FIG. 9 being performed entirely on memory die 108 such as by state machine 112.

Figure 10:
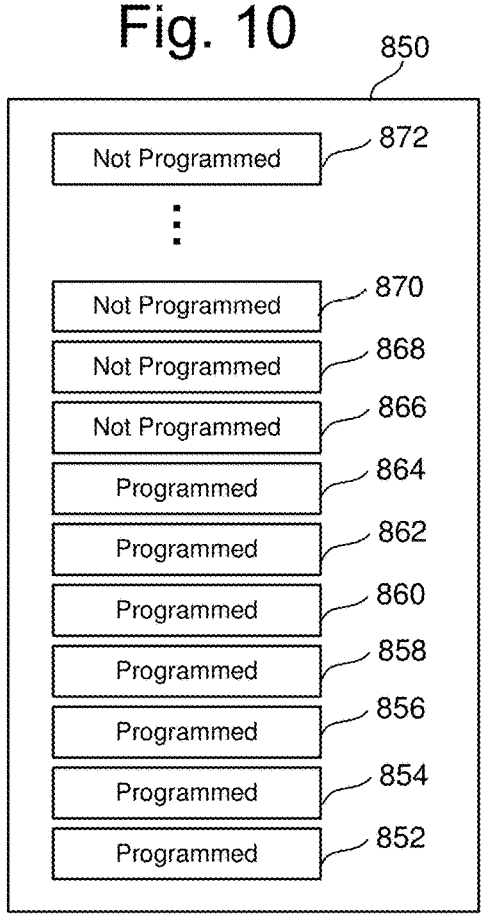
FIG. 10 depicts an open block.

FIG. 10 depicts a block of memory cells 850. Depicted in the block 850 are a set of word lines 852, 854, 856, 858, 860, 862, 864, 866, 868, 870 and 872. Each word line is depicted as a rectangle, representing the memory cells connected to that word line. Inside each rectangle is an indication of whether the memory cells have been subjected to programming (Programmed) or have not been programmed yet (Not Programmed). As can be seen, word lines 852-864 have been subjected to programming and those word lines are considered closed word lines. Word lines 866-872 have not been programmed; therefore, those word lines are open word lines. Word line 864 is a boundary word line because it is a closed word line that is adjacent an open neighbor word line 866. Word line 852 is an edge word line because it is a closed word line next to an open dummy word line. Step 840 includes identifying word lines with an open neighbor word line. In one example implementation of step 840, word lines such as word lines 852 and 864 are identified in step 840.

Figure 11:
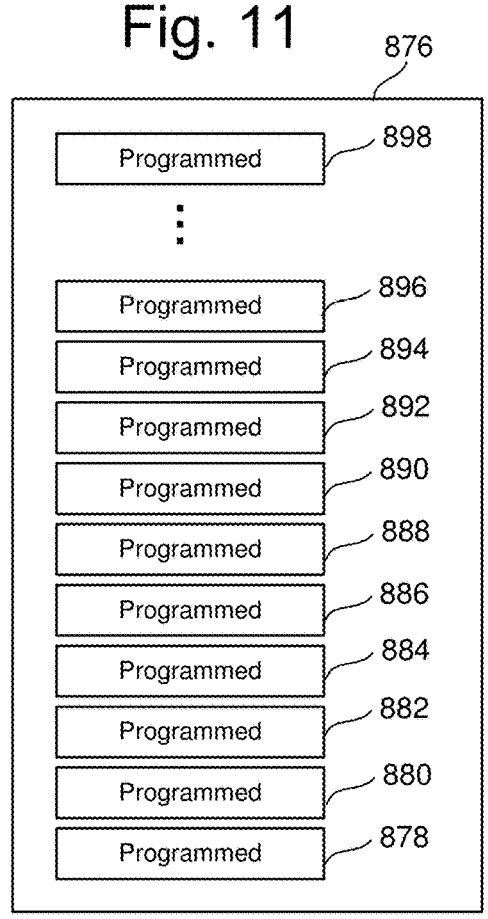
FIG. 11 depicts a closed block.

FIG. 11 depicts block 876 having word lines 878, 880, 882, 884, 886, 888, 890, 892, 894, 896 and 898. All of word lines 878-898 have received programming (Programmed); therefore, word lines 878-898 are all closed word lines and block 876 is a closed block. FIG. 11 only shows user data word lines. In one embodiment, user data word lines 878 and 898 are adjacent open dummy word lines, which are not depicted in FIG. 11. When user data word lines 878 and 898 are next to dummy word lines that are open, word lines 878 and 898 are edge word lines that will be identified in step 840 of FIG. 9.

In one embodiment, the physical word lines run across the entire block. This is depicted logically in FIGS. 10 and 11. Similarly, FIG. 4F shows physical word lines WLL0-WLL47 running across the entire block. In addition to physical word lines, the memory cells connected to a physical word line can be divided up into logical word lines based on the word line fingers discussed above. For example, FIG. 4D depicts how each word line layer is divided into word line fingers (see discussion above). For example, word line layer WLL46 is divided into four word line fingers 460, 462, 464 and 466. The dividing up of a word line layer or select line layer is further described with respect to FIG. 4B which shows SGDL0 broken up into fingers/regions 420, 430, 440 and 450. Each of the word line fingers can be thought of as a logical word line that is connected to those memory cells passing through the word line finger.

FIG. 12 is a table which shows one example of the relationship between physical word lines and logical word lines. The table only shows physical word lines WLL0-WLL6, however the same concept applies to the other word lines WLL7-WLL47. Each of the word lines depicted in FIG. 12 are broken up into four logical word lines, one logical word line for each of the four fingers (finger 0, finger 1, finger 2 and finger 3). Each of the logical word lines are labeled with a number 0-27. For example, physical word line WLL0 includes four logical word lines: 0, 1, 2 and 3. As an example to show how the process of FIG. 9 can be performed on logical word lines, FIG. 12 shows diagonal shading on logical word lines 0-17 to indicate that those logical word lines have already been programmed and, therefore, those logical word lines are closed logical word lines. Logical word lines 18, 19, 20 and 21 are also programmed and closed word lines. However, logical word lines 18-21 are not shaded in order to identify them as boundary word lines. Logical word lines 22-27 are shaded with vertical shading to indicate that they have not received programming and, therefore, they are open word lines. Because logical word line 18 is adjacent an open neighbor word line 22, logical word line 18 is a boundary word line. Because logical word line 19 is adjacent open neighbor word line 23, logical word line 19 is a boundary word line. Because logical word line 20 is adjacent open neighbor word line 24, logical word line 20 is a boundary word line. Because logical word line 21 is a closed word line that is adjacent open word line 25, logical word line 21 is a boundary word line. Therefore, boundary word lines 18, 19, 20 and 21 will be identified in step 840 of FIG. 9 and operated on in steps 842, 844 and 846.

Figure 13:
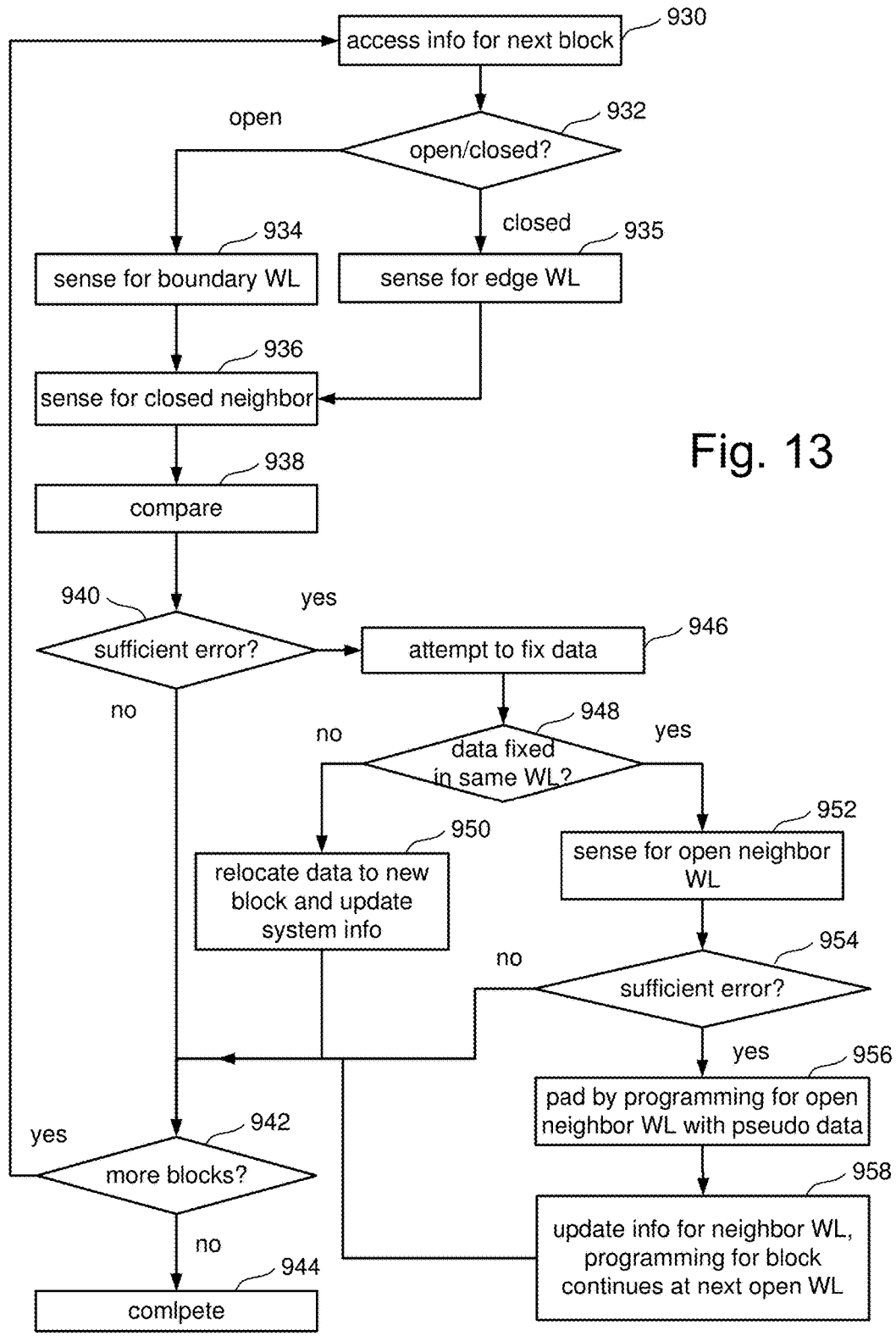
FIG. 13 is a flow chart describing one embodiment of an erratic word line maintenance process.

FIG. 13 is a flowchart describing one embodiment of a process for performing erratic word line maintenance in order to resolve the data retention issues described above. That is, FIG. 13 is one example implementation of the flowchart of FIG. 9. In step 930, controller 122 accesses system information for the next block. Based on that accessed information, controller 122 determines whether that block is open or closed in step 932. If the block is an open block then in step 934, controller 122 instruct memory die 108 to perform sensing for the boundary word line for that block. The sensing in step 934 can be a read process in order to read data. That data read will be subjected to an ECC process that will attempt to reconstruct the data from the stored code words. In the process of using the ECC engine 224 to recover the data read, the ECC engine will determine how many errors are in the data. This is referred to as a bit error rate (BER). In an alternative embodiment, instead of performing a read operation, controller 122 instruct memory die 108 to reconstruct the threshold voltage distributions (e.g., see FIG. 5). In step 936, controller 122 instruct memory die 108 to perform the same type of sensing operations for a closed neighbor. The same sensing operations that are performed in step 934 on the identified word line will be performed on its neighbor in step 936. Looking back at step 840 of FIG. 9, controller 122 identifies word lines with an open neighbor word line. It is contemplated that each word line will have two neighbor word lines. A boundary word line will have one neighbor word line that is an open word line and one neighbor word line that is a closed word line. For example, looking at FIG. 10, boundary word line 864 has neighbor word line 866 that is open and neighbor word line 862 that is closed. Step 936 is performed for the neighbor word line that is closed. In an alternative embodiment, step 936 can be performed for a closed word line in the same block that is not a neighbor word line. After performing step 936, controller 122 has data for the identified word line being investigated and a neighbor word line that is closed.

If, in step 932, controller 122 determined that the block under consideration is a closed block, then in step 935 the sensing is performed for an edge word line. The sensing of step 935 is the same type of sensing as steps 934 and 936. After step 935, the process continues at step 936 as described above.

In step 938, information from the sensing of step 934 (or step 935) is compared to information from the sensing of step 936. For example, the system can compare error information from step 936 to error information from step 934 (or step 935). One example of error information is the bit error rates (BRE) such that step 938 will include comparing the BER for the read from the identified word line in step 934 (or step 935) to the BER for the read from the closed neighbor word line in step 936. In another embodiment, the comparing of error information in step 938 includes comparing the locations of the threshold voltage distributions for the population of memory cells connected to the identified word line (steps 934 or 935) and the closed neighbor word line (step 936) to determine whether the two sets of threshold voltage distributions shifted the same amount or a different amount.

In step 940, controller 122 determine whether the error for the identified word line sensing in step 934 (or step 935) with respect to the sensing done for the closed neighbor word line step 936 is sufficient such that there is a true error condition that warrants remedial action. For example if the BER the identified word line is greater than the BER of the neighbor word line by more than a predetermined number. Alternatively, there will be an error condition if the threshold voltage distributions for the identified word line of step 934 (or step 935) is sufficiently shifted from the threshold voltage distributions of the closed neighbor word line by more than a predetermined amount. If there is not sufficient error, then in step 942, controller 122 determine whether there are any more blocks to access. If there are no more blocks to access, then the process of FIG. 13 is complete (step 944). If there are more blocks to process, then controller 122 accesses information in its system information tables for the next block and loops back to step 930.

If there was sufficient error found in step 940, then step in 946 controller 122 attempts to fix the data. In step 948, it is determined whether data was successfully fixed on the same word line that the data initially was on. If not, then controller 122 relocates the data by programming that data to a new block in step 950 and update its system information to identify the data being in the new block and new word line. After step 950, the process continues to step 942.

If the data was successfully fixed on the same word line then in step 952, controller 122 performs one or more sense operations for the open neighbor word line. For example, one or more sensing operations will be performed to see if the memory cells connected to the open neighbor have their threshold voltage shifted away from the fully erased condition (e.g. data state S0). If there is a sufficient amount of errors in the open neighbor word line then the memory cells connected to the open neighbor word line will be padded by programming those memory cells using pseudo data. Examples of pseudo data include copies of data on the identified word line, a predetermined data pattern, random data, or any other type of mock data. After padding the data in step 956, controller 122 updates the system information for the neighbor word line and programming can continue for that block at the next open word line (if there is one). After step 958, the process continues in step 942.

If, in step 954, it is determined that there was not sufficient error in the open neighbor word line, then the process will continue at step 942. Step 954 checks for "sufficient" error because in some embodiments a small number of errors can be tolerated. Therefore, step 954 will look for only the predetermined number of errors where the predetermined number can be any number including zero or greater than zero depending on the particular implementation.

Figure 14:
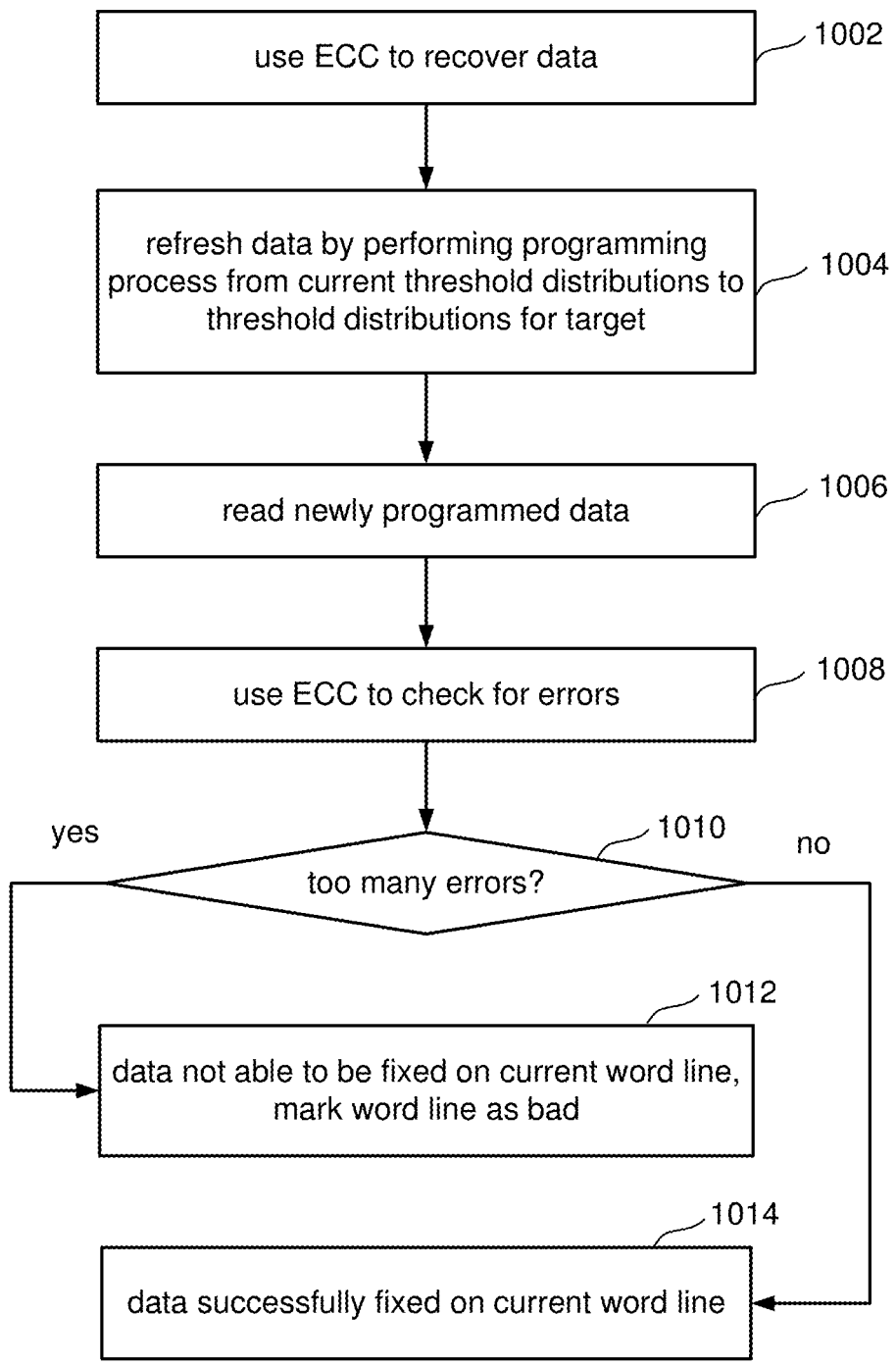
FIG. 14 is a flow chart describing one embodiment of a process for attempting to fix data.

FIG. 14 is a flowchart describing one embodiment for attempting to fix data. That is, the process depicted in FIG. 14 is one example implementation of step 946 of FIG. 13. In step 1002 of FIG. 14, controller 122 use ECC to recover the data. In one embodiment, the information received from the memory die 108 as part of the sensing operation will be used by ECC engine 224 of controller 122 as part of an ECC recovery process in order to recover the data from what was sensed. There are many standard ways for using error corrections known in the art. No particular ECC process is required for this technology. As well known in the art, ECC can be used to correct some errors from the data that is read. As described above (for example with respect to FIG. 7), a boundary or edge word line may have some of its data shifted which can cause an error. The ECC process can fix some of those errors during the data recovery process of step 1002.

In step 1004, the data being stored in the memory cells connected to the boundary or edge word line is refreshed by performing programming from the current threshold distributions to threshold distributions for the intended target of the data. For example, looking at FIG. 15, data will be refreshed by moving the threshold voltages of the memory cells from threshold voltage distributions 802, 804, 806, 808, 810, 812 and 814 to target data states S1, S2, S3, S4, S5, S6, S7. FIG. 15 shows arrow 1030 representing refreshing of data in memory cells from threshold voltage distribution 802 to data state S1, arrow 1032 representing refreshing of data in memory cells from threshold voltage distribution 804 to data state S2, arrow 1034 representing refreshing the data in memory cells from threshold voltage distribution 806 to data state S3, arrow 1036 representing the refreshing of data in memory cells from threshold voltage distribution 808 to data state S4, arrow 1038 representing refreshing of data in memory cells from threshold voltage distribution 810 to data state S5, arrow 1040 representing refreshing of data in memory cells from threshold voltage distribution 812 to data state S6 and arrow 1042 representing the refreshing of data in memory cells from threshold voltage distribution 814 to data state S7. In one implementation, controller 122 causes an attempt to refresh the data by instructing the memory die to perform the programming operations. As discussed above with respect to step 948 of FIG. 13, it is possible that the attempt to refresh the data is not successful.

In step 1006, controller 122 causes the newly programmed data to be read. For example, controller 122 issue one or more read commands to the memory die 108 to read out the data. In step 1008, the data read out and received by the controller 122 is subjected to an ECC process in order to determine whether there are any errors (bitt error rate), and, of so, how many errors. In step 1010, controller 122 determines whether there are too many errors. In some embodiments, a small number of errors may be tolerated because they can be fixed. If there are more than a predetermined number of errors, then in step 1012 controller 122 concludes that the data is not able to be fixed on the current word line and that word line is marked as a bad word line in the system information. If there are less errors than the predetermined number (there are not too many errors), then in step 1014, controller 122 concludes that the data was successfully fixed on the current word line. The conclusions in steps 1012 and 1014 affect the decision in step 948 of FIG. 13.

Note that in step 956 of FIG. 13, the open neighbor word line is padded by programming the memory cells connected to that word line with pseudo data. In one example of programming with pseudo data, the memory cells connected to the neighbor word line are programmed to the lowest program state (e.g. S1). Step 956 of FIG. 13 is depicted graphically by FIG. 16 which shows arrow 1140 representing the programming of the memory cells in threshold distribution 820 to data state S1 (1142).

Figure 17:
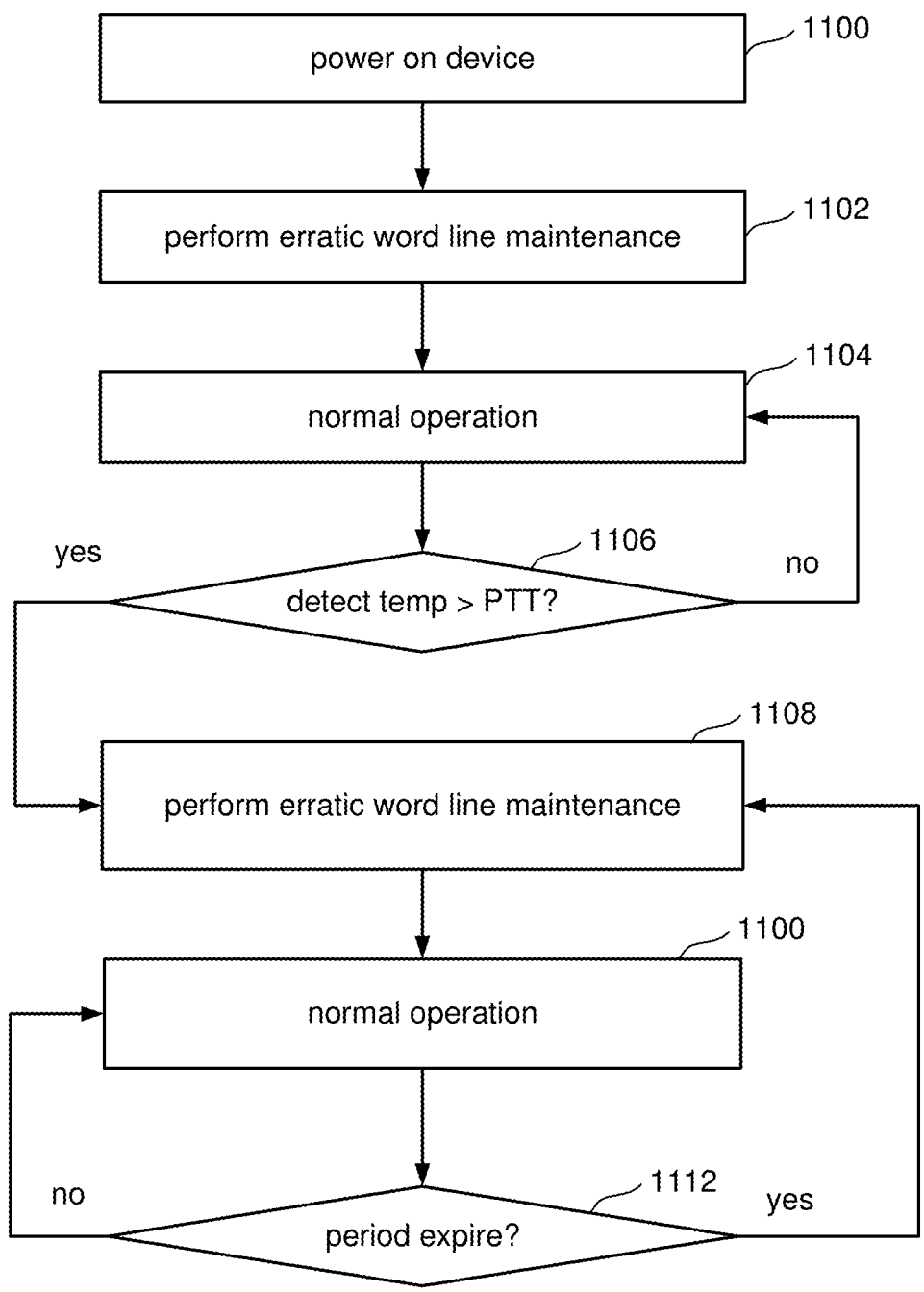
FIG. 17 is a flow chart describing one embodiment of a process for using an erratic word line maintenance process.

FIG. 17 is a flowchart describing one embodiment of a process for using the method of FIG. 9 or FIG. 13. In this embodiment, the method of FIG. 9 or 13 is performed at power on and when the temperature is detected to be above a predetermined trigger temperature. In step 1100, the device is powered on. This could include the host and memory system being powered on or just the memory system being powered on. In step 1102, the system performs the erratic word line maintenance, which includes performing the method of FIG. 9 or 13. In step 1104, the memory system performs normal operation, including programming, reading, and erasing. If controller 122 (or other device), does not detect that the current temperature is greater than a predetermined trigger temperature (step 1106), then the system will continue normal operations in step 1104. If the controller 122 (or other device), determines that the temperature is greater than the predetermined trigger temperature (in step 1106), then controller 122 will start the erratic word line maintenance method of FIG. 9 or 13. In step 1100, the system continues normal operation. After a particular time period (step 1112), the system will then once again perform the erratic word line maintenance method of FIG. 9 or 13. Until that period expires, normal operation will continue without performing the erratic word line maintenance. In this way, the erratic word line maintenance of FIG. 9 or 13 is performed at power on, when the temperature gets above a predetermined trigger temperature, or after a period of time.

Figure 18:
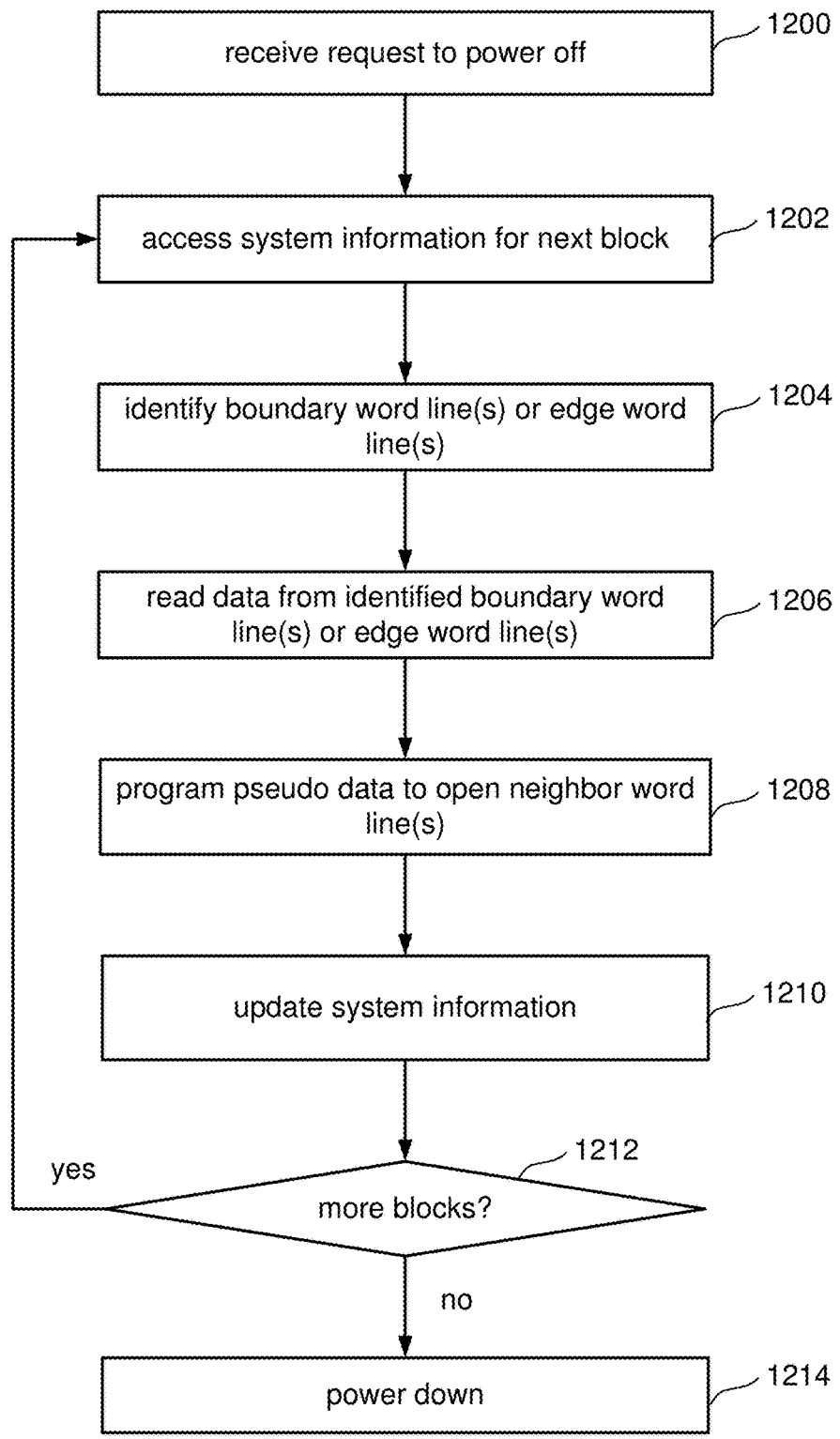
FIG. 18 is a flow chart describing one embodiment of a process for preventing data retention issues.

FIG. 18 is a flowchart describing one embodiment of a process for preventing data retention issues. In one embodiment, the system will pad the open word lines next to a boundary word lines and/or edge word line when the memory system powers down (or at a different time) so that the boundary word lines and edge word lines are shielded from drifting of electrons as described above. In step 1200, the system, or controller 122 (or another device) will receive a request to shut off the power. In step 1202, controller 122 access system information for the next block. In step 1204, within the block currently being considered, controller 122 uses the system information to identify any boundary word lines or edge word lines In step 1206, controller 122 instructs the memory dies to read the data stored in the memory cells connected to the identified boundary word lines or edge word lines. That information read is transferred from the memory die to the controller and subjected to the ECC process to determine the actual data stored. In step 1208, controller 122 instructs memory die 108 to program pseudo data to the open neighbor word lines for the identified boundary word lines and/or edge word lines. In one embodiment, the pseudo data programmed in step 1208 is a copy of the data read in step 1206. Thus, an open word line will be programmed with a copy of the data of its adjacent boundary word line or edge word line. In step 1210, the system information for the block is updated to reflect the programming of pseudo data. In step 1212, controller 122 determines whether there are any more blocks to consider. If there are more blocks to consider, then the next block is considered and the process loops back to step 1202. If all the blocks have been considered and there are no more new blocks to consider, then in step 1214 the system is powered down.

One embodiment includes non-volatile memory cells and one or more control circuits in communication with the memory cells. The one or more control circuits are configured to identify a word line with an open neighbor word line and determine whether data stored in non-volatile memory cells connected to the identified word line has an error condition. The one or more control circuits are configured to cause an attempt to fix the data if the data has an error condition. The one or more control circuits are configured to cause non-volatile memory cells connected to the open neighbor word line to be programmed with pseudo data.

One embodiment includes a method comprising determining whether non-volatile memory cells connected to a particular word line are storing data that has an error; if the data has an error, attempting to fix the error; and padding a neighbor word line that is adjacent the particular word line by programming memory cells connected to the neighbor word line with mock data.

One embodiment includes a memory interface circuit configured to communicate with non-volatile memory cells and one or more control circuits connected to the memory interface circuit. The one or more control circuits are configured to check accuracy of data stored in non-volatile memory cells connected to a particular word line. The one or more control circuits are configured to cause an attempt to refresh the data and to determine whether a set of memory cells connected to a neighbor word line that is adjacent to the particular word line has an error if the data has an error condition.

One embodiment includes one or more non-volatile memory cells and one or more control circuits in communication with the memory cells. The one or more control circuits are configured to identify a word line that is adjacent an open word line and program pseudo data into memory cells connected to the open word line in response to an attempt to power down.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a plurality of non-volatile memory cells;
a plurality of word lines connected to the non-volatile memory cells; and
one or more control circuits in communication with the plurality of non-volatile memory cells and the plurality of word lines, the one or more control circuits configured to identify a word line with an open neighbor word line and determine whether data stored in non-volatile memory cells of the plurality of non-volatile memory cells that are connected to the identified word line has an error condition, the one or more control circuits are configured to cause an attempt to fix the data if the data has an error condition, the one or more control circuits are configured to cause non-volatile memory cells of the plurality of non-volatile memory cells that are connected to the open neighbor word line to be programmed with pseudo data, the plurality of word lines includes the identified word line and the open neighbor word line.

2. The apparatus of claim 1, wherein:
the one or more control circuits configured to determine whether the non-volatile memory cells connected to the open neighbor word line have an error if the data has an error condition.

3. The apparatus of claim 1, wherein:
the one or more control circuits configured to cause the non-volatile memory cells connected to the open neighbor word line to be programmed with pseudo data in response to determining that the data has an error condition.

4. The apparatus of claim 1, wherein:
the one or more control circuits configured to determine whether data stored in the non-volatile memory cells connected to the identified word line has an error condition by sensing data in the non-volatile memory cells connected to the identified word line, sensing data in the non-volatile memory cells connected to a closed neighbor word line, and comparing error information from the sensing data in the non-volatile memory cells connected to the identified word line and the sensing data in the non-volatile memory cells connected to the closed neighbor word line.

5. The apparatus of claim 1, wherein:
the one or more control circuits configured to determine whether data stored in the non-volatile memory cells connected to the identified word line has an error condition by comparing threshold voltage distributions for the identified word line to threshold voltage distributions for a closed neighbor word line.

6. The apparatus of claim 1, wherein:
the one or more control circuits configured to cause an attempt to fix the data by causing programming to be applied to the non-volatile memory cells connected to the identified word line in order to refresh the data.

7. The apparatus of claim 1, wherein:
the error condition includes any one or more of a bit error rate above a target and a shift in threshold voltage distributions.

8. The apparatus of claim 1, wherein:
the one or more control circuits configured to cause the non-volatile memory cells connected to the open neighbor word line to be programmed with pseudo data by causing the non-volatile memory cells connected to the open neighbor word line to be programmed to a lowest programmed state.

9. The apparatus of claim 1, wherein:
the one or more control circuits configured to cause the non-volatile memory cells connected to the open neighbor word line to be programmed with pseudo data by causing the non-volatile memory cells connected to the open neighbor word line to be programmed with a copy of data stored in the non-volatile memory cells connected to the identified word line.

10. The apparatus of claim 1, wherein: the one or more control circuits identify the word line with the open neighbor word line and determine whether data stored in non-volatile memory cells connected to the identified word line has the error condition in response to a device power on.

11. The apparatus of claim 1, wherein:
the one or more control circuits identify the word line with the open neighbor word line and determine whether data stored in non-volatile memory cells connected to the identified word line has the error condition in response to detecting a temperature greater than a predetermined trigger temperature.

12. The apparatus of claim 1, wherein:
the identified word line is one of a logical word line or a physical word line;
the open neighbor word line is one of a logical word line or a physical word line;
the identified word line with an open neighbor word line is one of a boundary word line and an edge word line;
the open neighbor word line is one of a user data word line that is in a fully erased condition and a dummy word line that is in the fully erased condition;
the one or more control circuits implement a controller on a first die; and
the non-volatile memory cells are arranged on a second die.

13. The apparatus of claim 1, wherein:
the plurality of non-volatile memory cells include charge trapping layers; and
the plurality of non-volatile memory cells are arranged in a three dimensional memory structure.

14. A method, comprising:
determining whether non-volatile memory cells connected to a closed word line are storing data that has an error;
if the data has an error, attempting to fix the error; and
padding a neighbor open word line that is adjacent to the closed word line by programming memory cells connected to the neighbor open word line with mock data.

15. The method of claim 14, wherein:
the attempting to fix the error comprises using error correction to recover the data, refreshing the data in the non-volatile memory cells connected to the closed word line, reading back the refreshed data and checking the refreshed data for errors.

16. The method of claim 14, wherein:
the padding the open word line is performed in response to determining that the data has an error.

17. The method of claim 14, further comprising:
determining whether the memory cells connected to the neighbor open word line have an error in response to determining that the data has an error.

18. An apparatus, comprising:
a plurality of non-volatile memory cells;
a plurality of word lines connected to the non-volatile memory cells; and
one or more control circuits in communication with the plurality of non-volatile memory cells and the plurality of word lines, the one or more control circuits configured to identify a word line of the plurality of word lines that is adjacent an open word line of the plurality of word lines and program pseudo data into memory cells of the plurality of non-volatile memory cells that are connected to the open word line in response to an attempt to power down.

19. The apparatus of claim 18, wherein:
the pseudo data is a copy of data stored in memory cells connected to the identified word line.

20. An apparatus, comprising:
a plurality of non-volatile memory cells;
a plurality of word lines connected to the non-volatile memory cells; and one or more control circuits in communication with the plurality of non-volatile memory cells and the plurality of word lines, the one or more control circuits are configured to program pseudo data into memory cells of the plurality of non-volatile memory cells that are connected to an open word line of the plurality of word lines that is adjacent to a boundary word line of the plurality of word lines, the boundary word line is connected to one or more non-volatile memory cells of the plurality of non-volatile memory cells that are programmed with user data.

21. The apparatus of claim 20, wherein:
the one or more control circuits are configured to identify the boundary word line as a closed word line that is adjacent an open word line.

22. The apparatus of claim 20, wherein:
the pseudo data is a copy of data stored in non-volatile memory cells of the plurality of non-volatile memory cells connected to the boundary word line.

\* \* \* \* \*